455-617 AU 233 EX
FIP8106 XR 3,040,262

June 19, 1962 G. L. PEARSON 3,040,262

LIGHT SENSITIVE RESONANT CIRCUIT

Filed June 22, 1959 2 Sheets-Sheet 1

Parametric amp.

INVENTOR
G. L. PEARSON
BY H. W. Lockhart
ATTORNEY

June 19, 1962 G. L. PEARSON 3,040,262

LIGHT SENSITIVE RESONANT CIRCUIT

Filed June 22, 1959 2 Sheets-Sheet 2

INVENTOR
G. L. PEARSON
BY H. W. Lockhart
ATTORNEY

United States Patent Office 3,040,262
Patented June 19, 1962

3,040,262
LIGHT SENSITIVE RESONANT CIRCUIT

Gerald L. Pearson, Bernards Township, Somerset County, N.J., assignor to Bell Telephone Laboratories, Incorporated, New York, N.Y., a corporation of New York Filed June 22, 1959, Ser. No. 822,107
2 Claims. (Cl. 330—7)

This invention relates to light-responsive semiconductive devices and more specifically to circuit arrangements including such devices.

It is known that semiconductive material is photosensitive. That is, a beam of light directed at the surface of a semiconductive wafer generates electron-hole pairs in the semiconductive wafer by the absorption of photons. These extra charges increase the conductivity of the semi-conductive wafer in what is termed a photoconductive effect.

The absorption of photons within the space charge region of a P-N junction between two zones of opposite conductivity types in semiconductive wafers likewise produces electron-hole pairs. These charges are separated by the built-in field of the junction barrier. The electrons drift into the N-type region and the holes drift into the P-type region. As a result the two regions become oppositely charged and an electromotive force or E.M.F. appears across the terminal contacts of the P-N structure. This E.M.F. is termed a "photo-E.M.F." and a light dependent change appears in the junction capacitance. This is a photovoltaic effect.

However, if light is incident such that both junctions of a two junction semiconductive wafer are illuminated equally, the net photo-E.M.F. is substantially zero. This is because the effect on each junction is equal and opposite. Yet there nevertheless will be associated with the wafer a capacitance which will be dependent on the intensity of the light.

The recognition of this light-sensitive photo-capacitance in a two junction semiconductive wafer is the basis of the present invention. In particular, the invention relates to arrangements in which a semiconductive wafer is used as a variable capacitive element and light is used to vary the capacitance without the introduction of a photo-E.M.F.

In one aspect, the invention provides a novel form of tuned circuit in which light is used for tuning.

In another aspect, the invention provides a parametric amplifier in which light is used to vary the capacitance of the reactive element characteristic of such an amplifier.

The invention and the various features thereof will be understood more clearly and fully from the following detailed description with reference to the accompanying drawings in which.

It is to be understood that the figures are not necessarily to scale in order to better indicate the nature of the invention.

Figure 1:
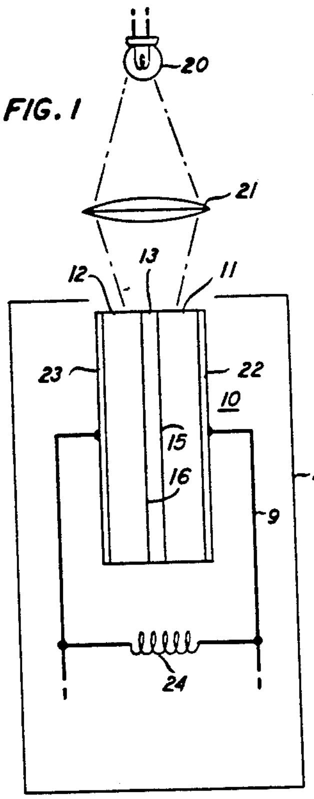
FIG. 1 shows a combination of light source and a variable capacitor connected in parallel with an inductor in accordance with the present invention.

In FIG. 1, the photosensitive device 10 comprises a body of semiconductive material, such as germanium or silicon, having two terminal zones 11 and 12 of P-type or, alternatively, N-type conductivity on opposite sides of and contiguous with a thin intermediate zone 13 of the opposite type conductivity, the three zones forming two rectifying junctions 15 and 16. Advantageously, the body is of a single crystal structure. The dimensions of such a structure may be typically .125 inch long, .020 inch thick and .040 inch wide with the N-type zone 13, .020 inch thick and symmetrically disposed between the two P-type zones. However, for high frequency applications each of the three conductivity zones would have, advantageously a thickness of the order of microns, a micron being equal to four hundred thousandths of an inch. A structure of such small dimensions is most easily fabricated by well-known vapor solid diffusion techniques.

One surface of the semiconductor body 10, or a portion thereof is illuminated from a light source 20, through a concentrating lens 21. Advantageously, the faces of the structure are treated to decrease the surface recombination rate of electrical carriers.

Terminals 22 and 23 are substantially ohmic connections to the P-type regions and are formed typically by evaporating about 1000 angstroms of a mixture of gold and gallium onto the surface of the wafer and alloying at approximately 500 degrees centigrade. Inductance 24 is connected in parallel with the semiconductive body 10 to form the modulator circuit 9 which may be used for example, as the tank circuit of a transmitter 25 of the type described in the February 1954 issue of "Electronics" magazine at page 130.

Figure 2:
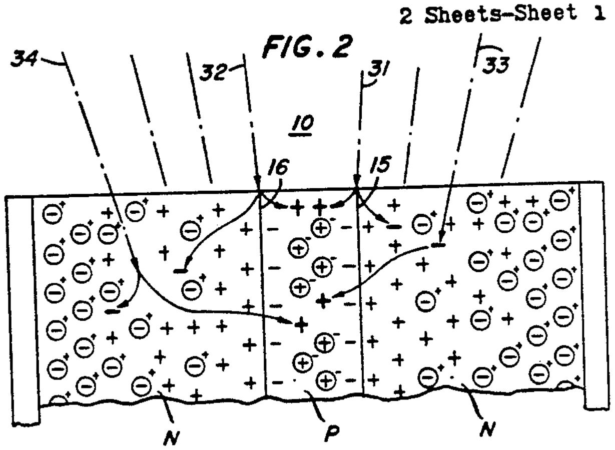
FIG. 2 depicts an N-P-N wafer in microscopic enlargement and is useful in explaining the mechanism of both the photoconductive and photovoltaic effects.

In FIG. 2 a photosensitive semiconductive body of the type described in FIG. 1 is depicted in microscopic enlargement. In accordance with convention, a plus sign represents a hole and a minus sign represents an electron. Incident photons 31 and 32 are absorbed within the space charge region of the junctions 15 and 16, respectively, creating electron-hole pairs. As indicated, the electron-hole pairs are separated by the built-in field of the barriers. The electrons drift into the N-type regions and the holes drift into the P-type regions. This accumulation of charges increases the capacitance of the P-N junction by moving the "plates" of the junction "capacitor" closer together. Although this tends to increase the flow of majority carriers across each barrier, the effect at one junction is equal and opposite to that at the other junction. Therefore, there is no net increase in majority carrier flow.

Photons 33 and 34 are absorbed in the N-type regions and again electron hole pairs are created. The holes diffuse to the P-type region and the electrons remain in the N-type region. This results in an increased electron current flow into the P-type region. This effect may be reduced by decreasing the thickness of the several conductivity regions. For example, if the thickness of each of the three conductivity regions of such a wafer is in the order of one minority carrier diffusion length, this effect is substantially avoided.

Figure 3:
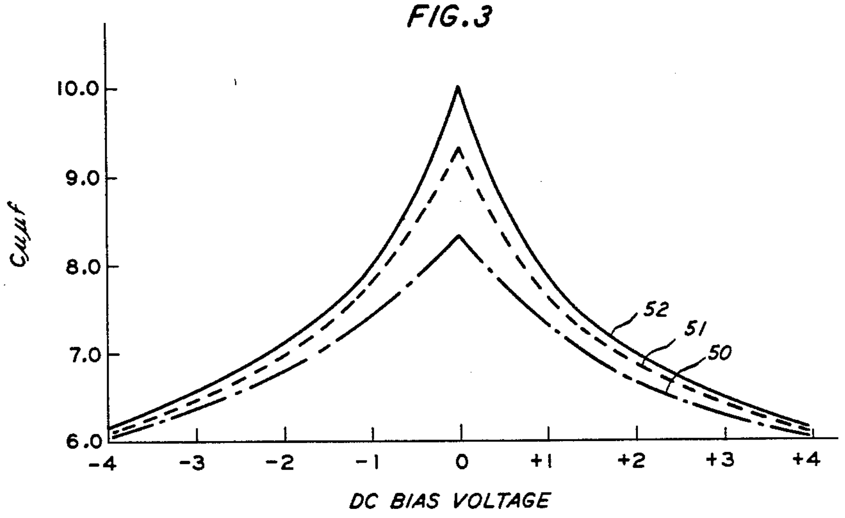
FIG. 3 is a graph illustrating the effect of light on the equivalent capacitance of the device.

In the graph of FIG. 3, the ordinate axis is capacitance in micro microfarads and the abscissa is D.C. bias in volts. Curve 50 depicts the capacitance-voltage response when no light is incident on the device. Curve 51 depicts the response when the light from a 500 watt lamp at 50 cms. is incident on the device. The intensity with this arrangement is 20 milliwatts per centimeter square (20 mw./cm.$^2$). Curve 52 depicts the response when the light intensity is increased to 80 mc./cm.$^2$ by reducing the lamp-to-surface spacing. The capacitance can be seen to increase with light intensity. The effects indicated by these curves were obtained by varying the distance between the light source and the device in order to vary light intensity only, and not the frequency or wavelength of the incident light.

The maximum wavelength and therefore the minimum energy of light which may be used to activate a semiconductive device of the type described herein, depends on the semiconductive material of which the device is constructed. It is necessary to have a light with a photon energy at least equal to the forbidden bandwidth. In germanium, the average forbidden bandwidth, that is, the average energy necessary to lift a minority carrier into the conducting range, is about 0.7 electron volt. This corresponds to a wavelength of from 1.7 to 1.8 microns which is in the middle range of the infra-red spectrum. Since, however, this value is an average, it is possible to activate hole-electron pairs with photons containing somewhat less than the energy represented by the average bandwidth, although in decreasing number, as the wavelength of the light is increased. Significant generation has been observed for light having wavelengths of upwards of 2.1 microns.

The average bandwidth of the forbidden region in silicon is about 1.12 electron-volts corresponding to a wavelength of light of about 1.2 microns. However, the generation of hole-electron pairs occurs with decreasing efficiency with light sources having photon energies of less than 1.12 electron-volts.

Figure 4:
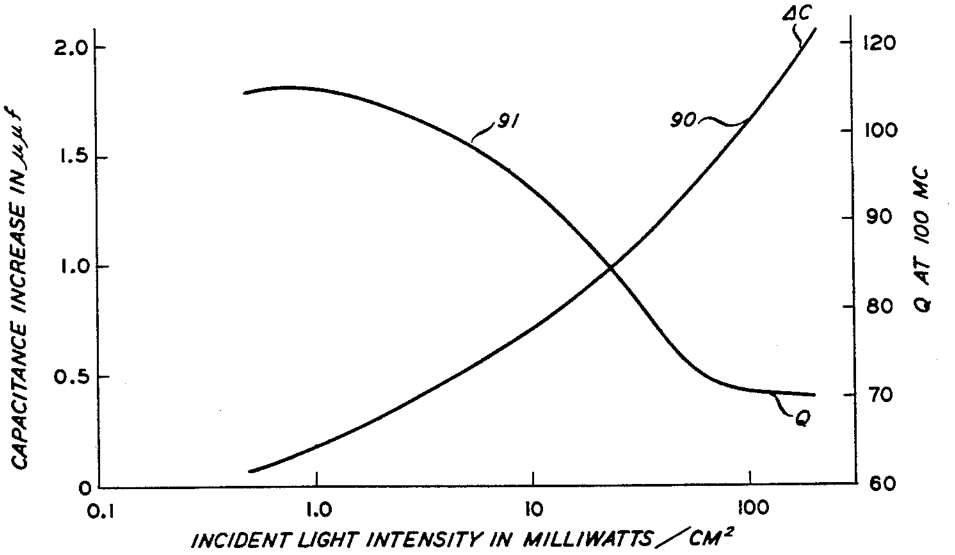
FIG. 4 is a graph illustrating graphically the capacitive response to changes in light intensity and the circuit Q at each intensity.

In FIG. 4 curve 90 is a typical plot of change in capacitance in micro microfarads versus incident light intensity in milliwatts per $cm.^2$ for the wafer shown in FIG. 1. For small variations of light intensity, the curve can be seen to be linear. Curve 91 indicates a typical variation of the Q of the tank circuit shown in FIG. 1.

Figure 5:
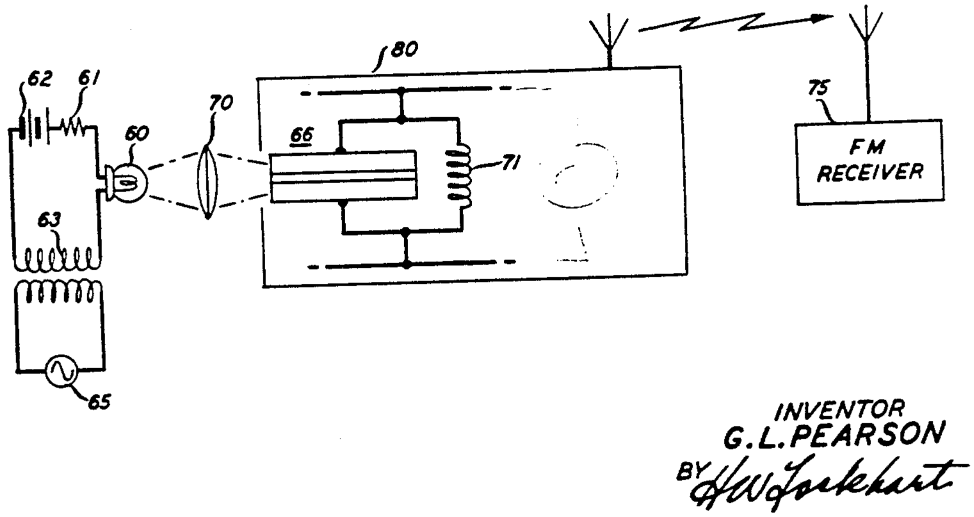

In FIG. 5 a light source 60 is connected in series with resistance 61, battery 62, and a winding 63 of a transformer, the other input winding of which is connected to the signal source 65. As the input signal varies, the intensity of light source 60 varies. This varying light signal is focused by concentrating lens 70 onto the photosensitive semiconductive body 66 of the kind described previously which is connected in parallel with inductance 71 whereby the resonant frequency of the parallel arrangement is varied as the light intensity varies. This parallel arrangement of body 66 and inductance 71 serves as the tank circuit of transmitter 80. The signal is now frequency modulated and may be picked up by a frequency modulated (F.M.) receiver 75. A change in light intensity of $$1\frac{mw.}{cm.^2}$$

was found to be sufficient to obtain a frequency variation of 75 kilocycles about a frequency of 128 megacycles.

Figure 6:
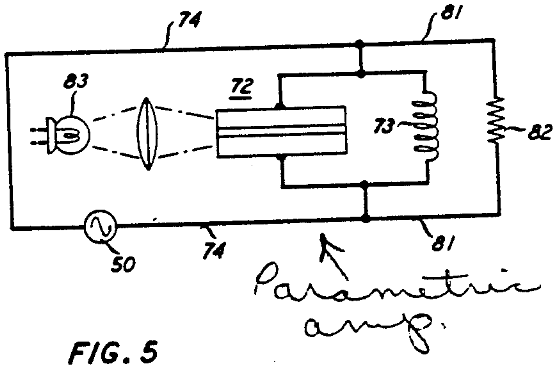
FIGS. 5 and 6 show systems embodying the principles of the present invention.

In FIG. 6 a parametric amplifier is depicted utilizing the invention wherein a signal of frequency $f$ from source 50 is impressed through leads 74 on a parallel arrangement 101 of the type shown in FIG. 1.

The intensity of light source 83 is varied with a frequency $f_p$. This signal replaces the conventional alternating current power source as the pump signal of a parametric amplifier of the type described in the January 1959 issue of the Journal of Applied Physics, volume 30, No. 1 at page 8, in an article entitled "Low Noise In Solid State Parametric Amplifiers at Microwave Frequencies" by W. E. Danielson. As such, the frequency of this pump signal is appropriately larger than that of the signal being amplified. In the degenerate case, which is the case depicted here, the pump frequency is made about twice the signal frequency which obviates the need for sustaining a separate idler frequency. The amplified signal is conducted through leads 81 to load 82.

A semiconductive element of the type useful in the arrangements shown in FIG. 1 has been fabricated by vapor solid diffusion techniques. An N-type signal crystal silicon element, 40 microns on a side had boron diffused into two opposite surfaces to a depth of 15 microns. The resulting structure was of P-N-P configuration. The resistivity of the P-type regions was about .005 ohm cms. and that of the N-type regions was about .01 ohm cms. This element was then connected in parallel with an inductance of approximately 24 microhenries to provide the tank circuit of a 100 megacycle transistor oscillator. The frequency of the oscillator was thereafter modulated by varying the light incident on the junctions of the wafer. The light was varied in accordance with an audio signal. The frequency modulated signal was thereafter demodulated and the audio signal recovered satisfactorily.

No effort has been made to exhaust the possible embodiments of the invention. It will be understood that the embodiments described are merely illustrative of the preferred form of the invention and the various modifications may be made therein without departing from the scope and spirit of this invention.

For example, the combination of semiconductive element, inductance and light source has application to F.M. translation of movie sound tracks where the sound film operates as the light valve.

What is claimed is:

1. In combination, a circuit comprising in parallel means for providing inductance and means for providing capacitance, said last means comprising a semiconductive device having a pair of terminal zones of like conductivity type and an intermediate zone of opposite conductivity type, said intermediate zone separating said terminal zones a distance equal to about a minority carrier diffusion length, separate electrode connections only to the two terminal zones, the intermediate zone being floating, and means for controlling the resonant frequency of said circuit without the introduction of a photovoltage comprising means for irradiating symmetrically the semiconductive device, means for varying the resonant frequency comprising means for varying the intensity of the radiation, and means for utilizing the resonant circuit.

2. A parametric amplifier comprising means for providing a variable capacitance, said means comprising a semiconductive device having two terminal zones of like conductivity type and an intermediate zone of the opposite conductivity type, separate electrode connections only to the two terminal zones, the intermediate zone being floating, a signal source for applying signal wave energy to be amplified to said capacitive means, means for providing inductance connected in parallel with said capacitive means, means for varying the capacitance of the capacitive means at a pumping frequency without introducing a photovoltage, said means comprising a light source whose intensity varies at the pumping frequency for irradiating the semiconductive device symmetrically about the intermediate zone, and means for utilizing the amplified signal wave energy connected across said capacitive means.

References Cited in the file of this patent

UNITED STATES PATENTS

| | | |
|---|---|---|
| 2,416,215 | Rath | Feb. 18, 1947 |
| 2,570,978 | Pfann | Oct. 9, 1951 |
| 2,641,713 | Shive | June 9, 1953 |
| 2,790,088 | Shive | Apr. 23, 1957 |
| 2,836,776 | Yoshioki Ishikawa et al. | May 27, 1958 |
| 2,862,416 | Doyle | Dec. 2, 1958 |
| 2,907,969 | Seidensticker | Oct. 6, 1959 |
| 2,914,665 | Linder | Nov. 24, 1959 |
| 2,919,389 | Heywang et al. | Dec. 29, 1959 |

FOREIGN PATENTS

| | | |
|---|---|---|
| 778,883 | Great Britain | July 10, 1957 |
| 1,034,694 | Germany | July 24, 1958 |